(12) United States Patent
Ito et al.

(10) Patent No.: US 11,177,111 B2
(45) Date of Patent: Nov. 16, 2021

(54) DEFECT OBSERVATION DEVICE

(71) Applicant: Hitachi High-Tech Corporation, Tokyo (JP)

(72) Inventors: Akira Ito, Tokyo (JP); Minoru Harada, Tokyo (JP); Yohei Minekawa, Tokyo (JP); Takehiro Hirai, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/824,872

(22) Filed: Mar. 20, 2020

(65) Prior Publication Data

US 2020/0335300 A1 Oct. 22, 2020

(30) Foreign Application Priority Data

Apr. 19, 2019 (JP) .............................. JP2019-079938

(51) Int. Cl.
*H01J 37/28* (2006.01)
*H01J 37/22* (2006.01)
(Continued)

(52) U.S. Cl.
CPC .............. *H01J 37/28* (2013.01); *G06N 20/00* (2019.01); *G06T 7/0004* (2013.01);
(Continued)

(58) Field of Classification Search
CPC .......... H01J 37/28; H01J 37/153; H01J 37/20; H01J 37/222; H01J 37/244; H01J 37/265;
(Continued)

(56) References Cited

U.S. PATENT DOCUMENTS 6,678,404 B1 1/2004 Lee et al.
8,452,718 B2 5/2013 Jin et al.
(Continued)

FOREIGN PATENT DOCUMENTS

JP 2001256480 A 9/2001
JP 2002515650 A 5/2002
(Continued)

OTHER PUBLICATIONS

Jun-Yan Zhu, et al., "Unpaired Image-to-Image Translation using Cycle-Consistent Adversarial Networks" arXiv preprint arXiv:1703.10593(2017).
(Continued)

*Primary Examiner* — Nicole M Ippolito
*Assistant Examiner* — Hanway Chang
(74) *Attorney, Agent, or Firm* — Miles & Stockbridge, P.C.

(57) ABSTRACT

A defect observation device is configured to include a charged particle microscope and a controller including a control unit that controls the charged particle microscope, a storage unit, and an arithmetic unit, in which the control unit controls the charged particle microscope under a first condition to acquire a first image of an observation target region of the sample, the arithmetic unit extracts first position information of the observation target region from the obtained first image, the control unit controls the charged particle microscope under a second condition to acquire a second image of the observation target region of the sample, and the arithmetic unit performs an image quality conversion process to match the image quality of the acquired second image with the image quality of the first image using the image quality conversion process parameters to process the second image subjected to the image quality conversion process.

15 Claims, 6 Drawing Sheets

(51) Int. Cl.
  *H01J 37/244* (2006.01)
  *H01J 37/26* (2006.01)
  *H01J 37/153* (2006.01)
  *G06N 20/00* (2019.01)
  *G06T 7/00* (2017.01)
  *H01J 37/20* (2006.01)

(52) U.S. Cl.
  CPC ............ *H01J 37/153* (2013.01); *H01J 37/20* (2013.01); *H01J 37/222* (2013.01); *H01J 37/244* (2013.01); *H01J 37/265* (2013.01); *G06T 2207/30148* (2013.01)

(58) Field of Classification Search
  CPC .................. G06N 20/00; G06T 7/0004; G06T 2207/30148
  See application file for complete search history.

(56) References Cited

U.S. PATENT DOCUMENTS

| | | |
|---|---|---|
| 2001/0051836 A1 | 12/2001 | Lamey et al. |
| 2004/0234120 A1 | 11/2004 | Honda et al. |
| 2006/0082763 A1 | 4/2006 | Teh et al. |
| 2006/0204103 A1 | 9/2006 | Mita et al. |
| 2011/0274362 A1 | 11/2011 | Isomae et al. |
| 2014/0072204 A1 | 3/2014 | Minekawa et al. |
| 2014/0341462 A1 | 11/2014 | Sezginer et al. |
| 2018/0174000 A1 | 6/2018 | Takagi et al. |
| 2018/0240225 A1 | 8/2018 | Harada et al. |

FOREIGN PATENT DOCUMENTS

| | | |
|---|---|---|
| JP | 2004295879 A | 10/2004 |
| JP | 2011155123 A | 8/2011 |
| JP | 2018137275 A | 8/2018 |
| WO | 2010076882 A1 | 7/2010 |
| WO | 2012144183 A1 | 10/2012 |

OTHER PUBLICATIONS

Phillip Isola, et al., "Image-to-Image Translation with Conditional Adversarial Networks" arXiv preprint arXiv:1611.07004(2016).

Tomlinson et al.; "In-Line SEM based ADC for Advanced Process Control" Proc. of 2000 IEEE/SEMI Advanced Semiconductor Manufacturing Conference; 2000; pp. 131-137.

DEFECT OBSERVATION DEVICE

CLAIM OF PRIORITY

The present application claims priority from Japanese Patent Application JP 2019-79938 filed on Apr. 19, 2019, the content of which is hereby incorporated by reference into this application.

BACKGROUND OF THE INVENTION

The present invention relates to a defect observation device that observes a circuit pattern or a defect formed on a semiconductor wafer serving as a sample by using a charged particle microscope and the like.

When a semiconductor wafer is manufactured, in order to ensure profitability, it is important to quickly start a manufacturing process and to proceed to a high yield mass-production system at an early stage. For this purpose, various inspection devices, devices for observing a defect on a sample, or measuring devices are introduced to manufacturing lines.

The technique disclosed in JP-A-2018-137275 (Patent Document 1 1) describes a technique for a sample observation device, which is aimed to achieve both improvement of the throughput by shortening the time for capturing an image for sample observation and obtainment of a high quality image of the sample.

More specifically, a sample observation device is disclosed, which includes an image storage unit that stores a degraded image having a poor image quality and a high quality image having a satisfactory image quality which are acquired at the same location of the sample by causing the charged particle microscope to change an imaging condition for imaging the sample, an arithmetic unit that calculates estimation process parameters for estimating the high quality image from the degraded image using the degraded image and the high quality image stored in the image storage unit, a high quality image estimation unit that estimates a high quality image of a desired site by processing the degraded image of the desired portion of the sample obtained by imaging the desired portion of the sample with the charged particle microscope by using the estimation process parameters calculated by the arithmetic unit, and an output unit that outputs the estimated high quality image estimated by the high quality image estimation unit.

A defect observation device is a device that captures, with high resolution, a defect position on a wafer based on defect position coordinates (coordinate information indicating a position of a defect on the sample) output from an inspection device and outputs the image, and for this, an observation device (hereinafter, referred to as a review SEM) using a scanning electron microscope (SEM) is widely used.

In semiconductor mass-production lines, automation of observation work is desired, and the review SEM has a function of performing automatic defect image collection process (ADR: Automatic Defect Review) for automatically collecting images at defect positions in a sample, automatic defect image classification process (ADC Automatic Defect Classification) for automatically classifying the collected defect images, and energy dispersive X-ray analysis (EDS, EDX: Energy Dispersive X-ray Spectrometry) for automatically analyzing the composition of the defect.

In the defect observation device, it is important to acquire more images per unit time (operate with higher throughput) and to reduce the burden of the user on parameter adjustment.

When performing a plurality of processes, such as performing EDS after performing ADR for each defect, since a shift in imaging range occurs due to a change in imaging conditions, an error in stage movement, and the like, it is necessary to perform defect detection for each process. However, when imaging conditions are changed such as in the case of performing EDS after ADR, since the image quality of the image is significantly varied, it is necessary to adjust the defect detection parameter for each imaging condition, and the burden of the user on parameter adjustment increases.

Therefore, when it is possible to calculate a positional shift amount between an image captured under a first imaging condition (for example, under ADR imaging condition) and an image captured under a second imaging condition (for example, under EDS imaging condition), the defect coordinates in the image under the second imaging condition can be calculated by using the defect coordinates in the image under the first imaging condition.

However, in practice, the image captured under the first imaging condition and the image captured under the second imaging condition have significantly different image qualities due to different respective imaging conditions, in which case it is difficult to apply the image position alignment process required for calculating the positional shift amount.

In the method described in JP-A-2018-137275, with respect to the two images having significantly different image qualities as described above, JP-A-2018-137275 does not describe performing a position alignment of the two images to such an extent that the positional shift amount can be accurately calculated.

SUMMARY OF THE INVENTION

The present invention solves the above-described problem of the related art, and provides a defect observation device which is capable of improving throughput and reducing the burden of the user by enabling a defect coordinate in an image under the second imaging condition to be calculated using a defect coordinate in an image under the first imaging condition, so that adjustment of defect detection parameters is unnecessary under the second imaging condition.

In order to solve the above-mentioned problem, in the present invention provides a defect observation device including a charged particle microscope and a controller, in which the charged particle microscope includes an energy source that is irradiated with an observation energy to irradiate the sample, a table on which a sample is placed, and a detector, and the controller is configured to:

(A) acquire a first image which is a first type of image in which a predetermined portion of the sample is imaged using a first imaging condition, and acquire a first coordinate that indicates a region where the predetermined portion in the first image is imaged, (B) acquire a second image which is a second type of image in which the predetermined portion is imaged using a second imaging condition, (C) input the first image or the second image to an image quality conversion program to acquire one or more images of the predetermined portion, (D) estimate, based on the image of the predetermined portion, a difference between the first coordinate and a second coordinate that indicates a region where the predetermined portion in the second image is imaged, and (E) acquire the second coordinate based on the difference estimated in (D) and the first coordinate, and in which the acquiring the one or more images of the predetermined portion in (C) includes one or more acquisition processes of:

(1) a first acquisition process of converting the first image from the first type to the second type by the image quality conversion program to acquire one or more predetermined images, (2) a second acquisition process of converting the second image from the second type to the first type by the image quality conversion program to acquire one or more predetermined images, and (3) a third acquisition process of converting the first image and the second image to a third type different from the first and second types by the image quality conversion program to acquire one or more predetermined images.

According to the present invention, it is possible to calculate an positional shift amount between an image captured using the first imaging condition and an image captured using the second imaging condition, and thus a defect coordinate in the image captured using the second imaging condition can be calculated using a defect coordinate in the image captured using the first imaging condition, so that it is not necessary to adjust the defect detection parameters when capturing using the second imaging condition, thereby improving the throughput and reducing the burden of the user.

DESCRIPTION OF EMBODIMENTS

Figure 1:
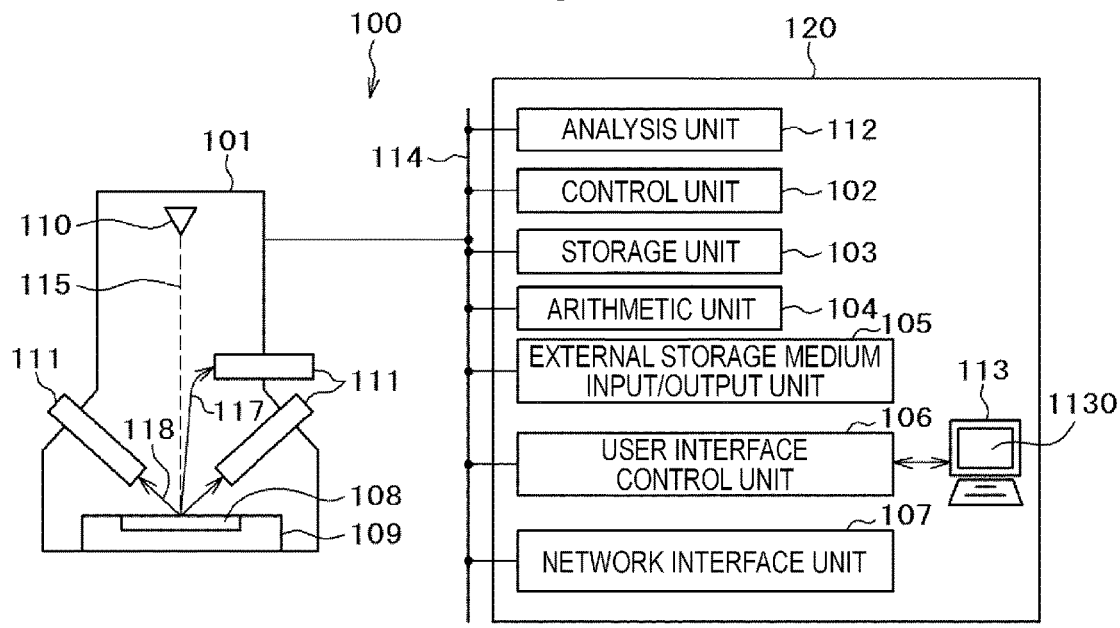
FIG. 1 is a block diagram showing a schematic configuration of a defect observation device according to a first embodiment.

In order to put the defect observation device to practical use, it is important to acquire more images per unit time (operate with higher throughput) and to reduce the burden of the user on parameter adjustment.

However, when performing a plurality of processes such as performing analysis of a composition of an observation target defect with EDS after performing extraction of an image of the observation target defect with ADR for each defect, there is a possibility that a shift in the imaging range occurs due to a change in the imaging conditions, an error in the stage movement, and the like. In order to prevent the occurrence of the positional shift, it is necessary to detect the observation target defect and correct the positional shift for each process. However, when the imaging conditions are changed, the image quality of the obtained image is significantly different, so it is necessary to adjust the defect detection parameters for each imaging condition. As a result, the burden of the user on parameter adjustment increases.

Therefore, when it is possible to calculate a positional shift amount between an image captured under a first imaging condition (for example, under ADR imaging condition) and an image captured under a second imaging condition (for example, under EDS imaging condition), the defect coordinates in the image under the second imaging condition can be calculated by using the defect coordinates in the image under the first imaging condition, and this eliminates a need for the adjustment of the defect detection parameter under the second imaging condition, thus making it possible to improve the throughput and reduce the burden of the user.

However, when acquiring an image using SEM, the acceleration energy of the primary electrons irradiating the sample is significantly different between a first imaging condition (for example, ADR imaging condition) for observing a defect and a second imaging condition (for example, EDS imaging condition) for analyzing the defect. As a result, an image obtained under the first imaging condition and an image obtained under the second imaging condition have significantly different image qualities, and in this state, it is difficult to apply the image position alignment process required for calculating the positional shift amount.

According to the present invention, it possible to calculate the positional shift amount between an image captured under the first imaging condition (for example, ADR imaging condition) and an image captured under the second imaging condition (for example, EDS imaging condition), so that it is possible to calculate the defect coordinates in the image captured using the second imaging condition, by using the coordinates of a defect, that is the region of interest, in the image captured using the first imaging condition. As a result, it unnecessary to adjust the defect detection parameters under the second imaging condition, resulting in improvement of the throughput and reduction of the burden of the user.

Further, according to the present invention, in order to improve the defect observation throughput and reduce the burden of the user by enabling the defect coordinates in the image under the second imaging condition to be calculated using the defect coordinates that is the region of interest in the image under the first imaging condition, a defect observation device is configured to include a charged particle microscope and a controller including a control unit that controls the charged particle microscope, a storage unit, and an arithmetic unit, in which the control unit controls the charged particle microscope under a first condition to acquire a first image of an observation target region of a sample, the arithmetic unit extracts first position information of a region of interest that is an observation target from the acquired first image, the control unit controls the charged particle microscope under a second condition to acquire a second image of the region of interest of the sample, and the arithmetic unit performs an image quality conversion process to match the image quality of the acquired second image with the image quality of the first image using an image quality conversion process parameter stored in the storage unit, extracts a region of interest in the second image subjected to the image quality conversion process, and analyzes a composition of the extracted region of interest.

Hereinafter, embodiments of the present invention will be described in detail with reference to the drawings. In all the drawings for describing the present embodiment, components having the same function are denoted by the same reference numerals, and repetitive description thereof will be omitted in principle.

Note that the present invention is not construed as being limited to the description of the embodiments below. It is easily understood by those skilled in the art that the specific configuration can be changed without departing from the spirit or gist of the present invention.

First Embodiment

In the present embodiment, a defect observation device provided with a scanning electron microscope (SEM) will be described as an imaging device for imaging a sample. However, the imaging device according to the present embodiment may be any other device in addition to the SEM, and may be an optical microscope or an imaging device using charged particles such as ions. In addition, although an image obtained by imaging a defect on a semiconductor wafer is described as the observation target image, an image obtained by imaging another sample such as a flat panel display or a biological sample may also be used.

FIG. 1 shows a configuration of a defect observation device 100 including an imaging device 101 using SEM (hereinafter, referred to as an SEM 101) according to the present embodiment (note that, in the configuration shown in FIG. 1, the illustration of a system equipped with an optical microscope for detecting the position of a defect at a lower magnification than the SEM 101 is skipped). The defect observation device 100 is configured to include the SEM 101 having a charged particle optical system that captures a sample, and a control system unit 120.

The SEM 101 is configured to include a stage 109 on which a sample wafer 108 serving as an observation target is loaded and which is movable in an X-Y plane or in an X-Y-Z space, an electron source 110 that is a charged particle optical system which generates an electron beam 115 that is a charged particle beam for irradiating the sample wafer 108, and a detector 111 that detects a secondary electron 117, a backscattered electron 118, an X-ray (not shown), and the like generated from the sample wafer 108 irradiated with the electron beam 115, and additionally, is configured to include an electron lens (not shown) that converges the electron beam 115 on the sample wafer 108, and a deflector (not shown) that scans the sample wafer 108 with the electron beam 115.

The control system unit 120 includes a control unit 102 that performs overall control, a storage unit 103 that stores information in a magnetic disk, a semiconductor memory, and the like, an arithmetic unit 104 that performs an operation according to program, an external storage medium input/output unit 105 that inputs and outputs information to and from an external storage medium connected to the device, a user interface control unit 106 that controls input and output of information with a user, a network interface unit 107 that communicates with a defect image classification device (not shown) and the like through the network 114, and an analysis unit 112 that analyzes the composition of the sample.

Figure 2:
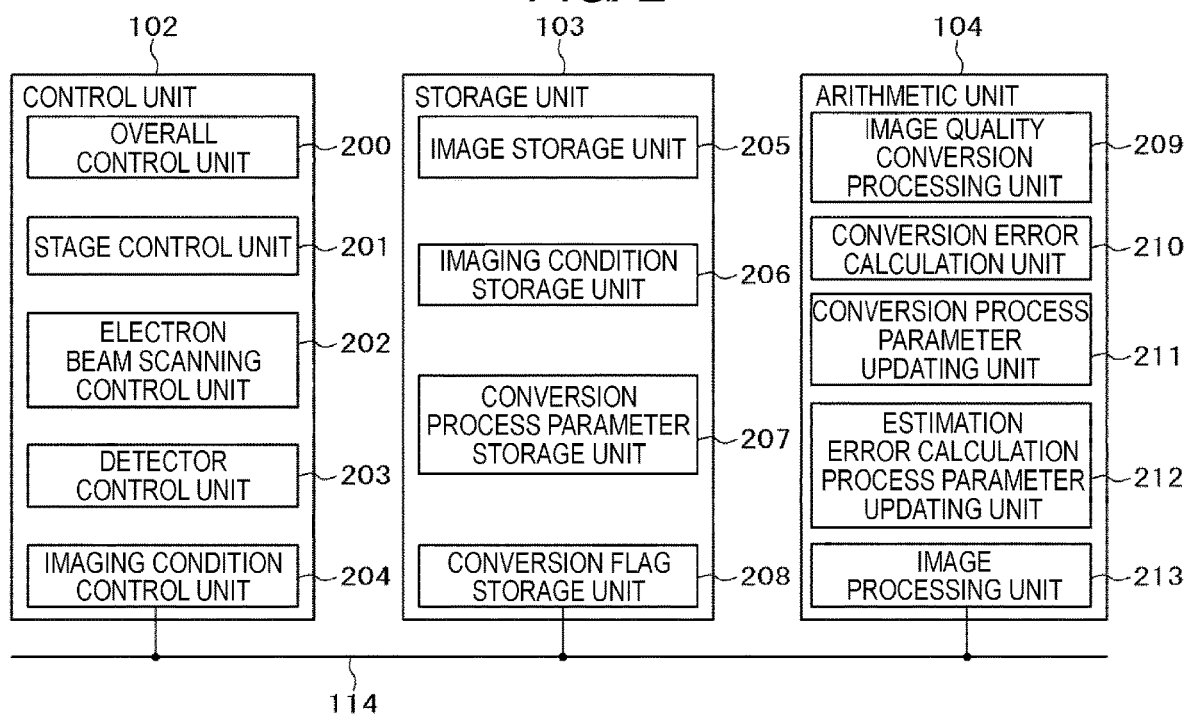
FIG. 2 is a block diagram showing an internal configuration of a control unit, a storage unit, and an arithmetic unit of the defect observation device according to the first embodiment.

FIG. 2 shows a configuration of the control unit 102, the storage unit 103, and the arithmetic unit 104 of the control system unit 120 according to the present embodiment.

The control unit 102 includes an overall control unit 200, a stage control unit 201, an electron beam scanning control unit 202, a detector control unit 203, and an imaging condition control unit 204.

The storage unit 103 includes an image storage unit 205 that stores the generated digital image together with additional information, an imaging condition storage unit 206 that stores imaging conditions and the like, a conversion process parameter storage unit 207 that stores parameters related to the image quality conversion process, and a conversion flag storage unit 208 that stores the imaging conditions of a conversion source and a conversion target of the image quality conversion to be performed.

Further, the arithmetic unit 104 includes an image quality conversion process unit 209 that matches the image qualities of images having different imaging conditions based on process parameters, a conversion error calculation unit 210 that calculates an error between a first type image obtained by imaging with the imaging conditions of the SEM 101 being set to the imaging conditions suitable for ADR, and an image obtained by converting a second type image, which is obtained by imaging with the imaging conditions being set to the imaging conditions suitable for EDS, to the same image quality as the first type image, a conversion process parameter updating unit 211 that updates parameters of the estimation process based on the conversion error calculated by the conversion error calculation unit 210, an estimation error calculation process parameter updating unit 212 that updates the parameters of the estimation error calculation process based on the first type image and the converted image, and an image processing unit 213 that processes an image obtained by imaging and performs a process such as extraction of a defect position, position alignment of the defect image, and the like.

In addition, an input/output terminal 113 including a keyboard, a mouse, a display 1130, and the like is connected to the user interface control unit 106.

Figure 3:
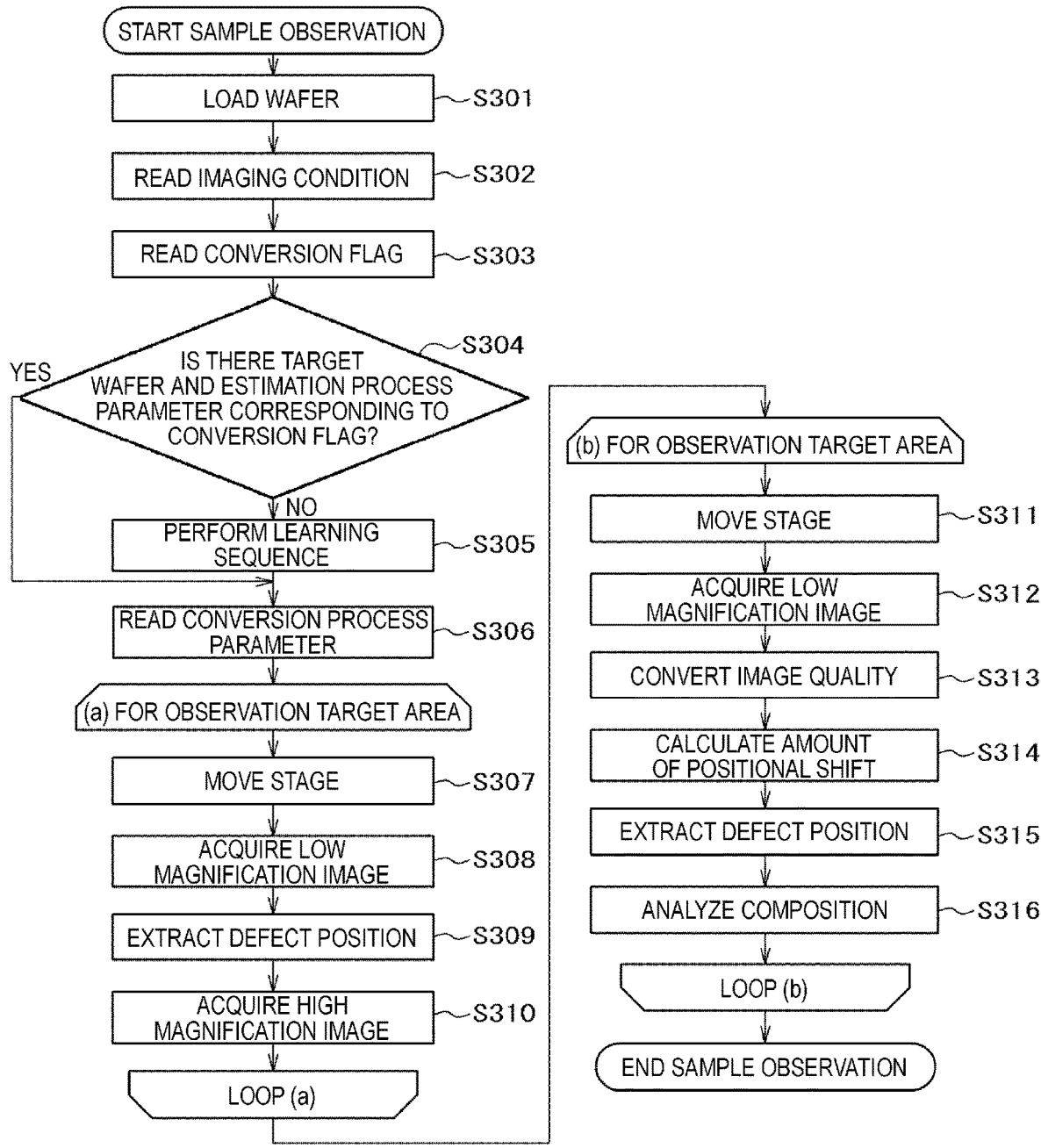
FIG. 3 is a flowchart showing a process flow of a defect observation method according to the first embodiment.

A method of observing a sample (observation procedure) using the defect observation device 100 having the configuration shown in FIGS. 1 and 2 will be described with reference to FIG. 3.

First, a semiconductor wafer (sample wafer) 108 serving as an observation target is loaded on the stage 109 (S301). Next, the imaging condition control unit 204 reads the imaging conditions corresponding to the sample wafer 108 serving as the observation target from the imaging condition storage unit 206 (S302). Further, when performing image quality conversion, the imaging condition control unit 204 reads, from the conversion flag storage unit 208, the imaging condition of the image quality conversion source and the imaging condition of the image quality conversion target (S303).

The semiconductor pattern formed on the sample wafer 108 is manufactured through a number of manufacturing processes, and shape thereof may vary greatly in each process. Further, in some cases, characteristics of the sample such as charging convenience may vary. Therefore, in general, the imaging condition is adjusted and stored for each process or each device. For the same reason, the estimation accuracy is improved by managing the image quality conversion process parameters stored in the conversion process parameter storage unit 207 for each imaging condition and each process.

After reading the imaging condition and the conversion flag, the overall control unit 200 determines whether an image quality conversion process parameter corresponding to the process performed on the sample wafer 108 and the conversion flag is stored in the conversion process parameter storage unit 207 (S304).

When the overall control unit 200 determines that the conversion process parameter is not stored in the conversion process parameter storage unit 207 (when "NO" in S304), the image quality conversion process parameter is learned by a learning sequence described below and then stored in the conversion process parameter storage unit 207 (S305), and the process proceeds to the next step S306.

Meanwhile, when the overall control unit 200 determines that the image quality conversion process parameter is stored in the conversion process parameter storage unit 207 (when "YES" in S304), the image quality conversion process parameter is read from the conversion process parameter storage unit 207 (S306).

Next, an observation target region on the sample wafer 108 is sequentially imaged using the SEM 101 under the imaging condition for ADR, and a series of observations are performed.

In the series of observations, first, the stage control unit 201 controls and adjusts the stage 109 so that the observation target region on the sample wafer 108 is included in an imaging visual field of view of the SEM 101 (S307). Next, the electron beam scanning control unit 202 controls the SEM 101 to irradiate and scan the sample wafer 108 with the electron beam 115. The secondary electron 117 and the backscattered electron 118 generated from the observation target region irradiated with the electron beam 115 are detected by the detector 111 controlled by the detector control unit 203.

The detection signal from the detector 111 that detects the secondary electron 117 and the backscattered electron 118 is input to the image processing unit 213 and processed so that an image (digital image) of the observation target region is acquired (S308). The acquired image of the observation target region is stored in the image storage unit 205.

Furthermore, the image acquired in S308 is processed by the image processing unit 213, and the coordinate p1 of the defect is extracted from the digital image (S309). Next, the electron beam scanning control unit 202 controls the SEM 101 using the information on the extracted coordinate p1 of the defect so that a high-magnification defect image is acquired (S310). The acquired high-magnification defect image is stored in the image storage unit 205.

The imaging processes from S307 to S310 described above are repeatedly performed for a plurality of observation target regions of the sample wafer 108. Note that the observation target region may be a region including a defect site detected in advance by an optical defect inspection device (not shown) or may be a region designated by a user, for example.

Next, a series of observations are performed by sequentially imaging under the imaging conditions for EDS. First, the stage control unit 201 controls and adjusts the stage 109 so that the observation target region on the sample wafer 108 is included in the imaging visual field of view of the SEM 101 (S311).

Next, the electron beam scanning control unit 202 sets the irradiation conditions (acceleration voltage of the electron beam 115 and the like) of the electron beam 115 of the SEM 101 to the conditions for EDS based on the imaging condition stored in the imaging condition storage unit 206, and the sample wafer 108 is irradiated and scanned with the electron beam 115.

The secondary electron 117 and the backscattered electron 118 generated from the observation target region irradiated with the electron beam 115 set under the conditions for EDS are detected by the detector 111 controlled by the detector control unit 203 and processed by the image processing unit 213 so that an image (digital image) of the observation target region is acquired (S312). The acquired image of the observation target region is stored in the image storage unit 205.

However, since a positional shift occurs due to a control error of the stage 109 and the like, the defect position extracted from the image obtained by imaging under the imaging conditions for ADR in S309 and the defect position of the image obtained by imaging under the imaging conditions for EDS in S312 may be different from each other. Therefore, it is necessary to extract the defect position in the image obtained by imaging under the imaging condition for EDS in S312.

Therefore, in order to match the image qualities of the image obtained by imaging under the imaging conditions for EDS in S312 with those of the digital image obtained by imaging under the imaging conditions for ADR in S308 including the same defect, the image quality conversion process unit 209 performs an image quality conversion process on the image stored in the image storage unit 205 using the conversion process parameters stored in the conversion process parameter storage unit 207 (S313).

Next, by using the image of which the image quality is converted by performing the image quality conversion process in the image quality conversion process unit 209, the image processing unit 213 performs position alignment of the image acquired by imaging under the imaging conditions for EDS in S312 with the image including the same defect which is acquired by imaging under the imaging conditions for ADR in S308, to calculate a positional shift amount A (S314).

Next, the image processing unit 213 extracts the defect position in the image obtained by imaging under the imaging conditions for ADR based on the defect coordinates extracted from the image obtained by imaging under the imaging conditions for ADR in S309 and the positional shift amount A calculated in S314 (S315). Next, at the electron beam scanning control unit 202, with the irradiation condition of the electron beam 115 being set to the conditions for EDS, the defect position extracted in S315 is irradiated with the electron beam 115. The X-ray generated from the defect position irradiated with the electron beam 115 is detected by the detector 111 controlled by the detector control unit 203. With respect to the X-ray spectrum detected by the detector 111, a composition analysis is performed by the analysis unit 112 (S316).

The processes from S311 to S316 described above are repeatedly performed for a plurality of observation target regions of the sample wafer 108. Note that the observation target region is the same as the observation target region of (a) in FIG. 3.

Further, the learning sequence (S305) may be appropriately performed by a user's instruction through a graphic user interface (GUI) and the like displayed on a display 1130 of the input/output terminal 113 of the user interface control unit 106.

In the image quality conversion process (S313) performed by the image quality conversion process unit 209, the image quality of the image acquired in S308 is converted into the image quality of the image acquired in S312, or the image quality of the image acquired in S312 is converted into the image quality of the image acquired in S308.

Figure 4:
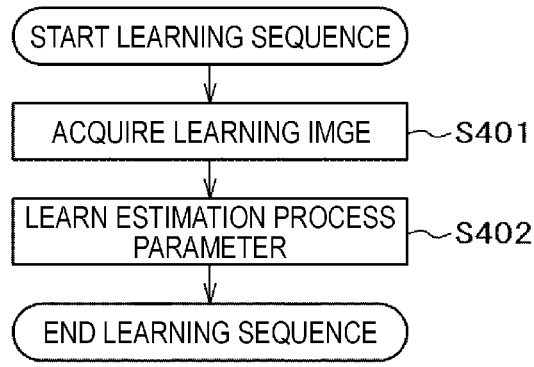
FIG. 4 is a flowchart showing a process flow of a learning sequence according to the first embodiment.

As shown in FIG. 4, the learning sequence in S305 indicates a series of flows in the acquisition of a learning objective image (S401) and learning of the estimation process parameter (S402).

Figure 5:
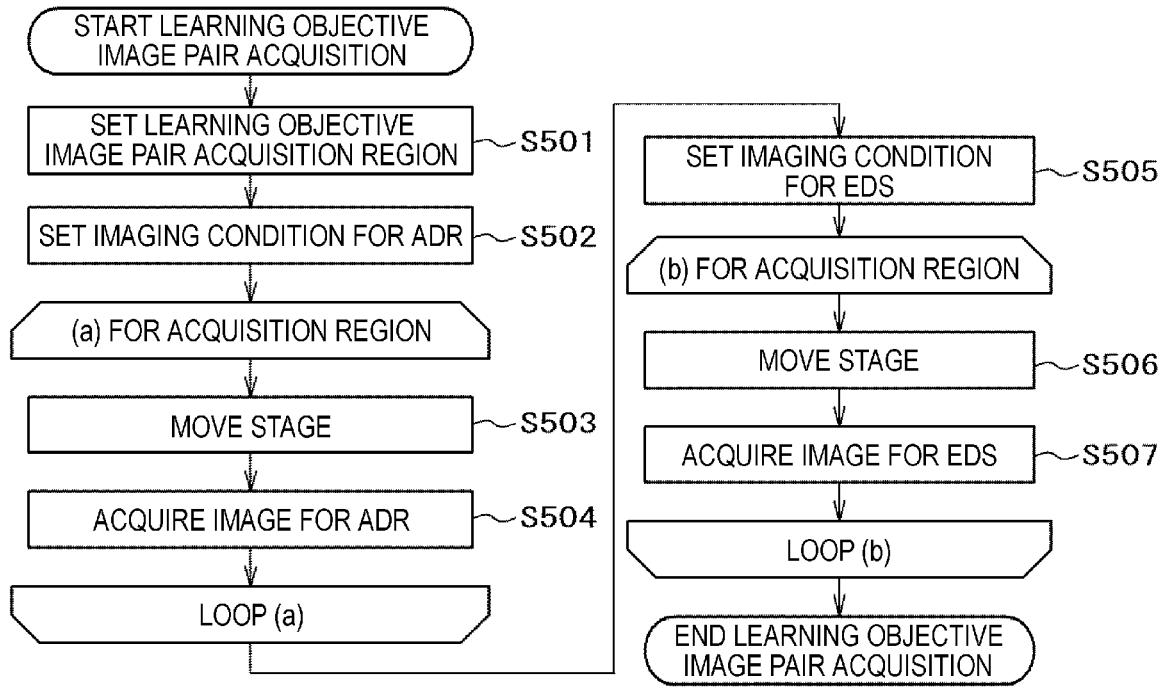
FIG. 5 is a flowchart showing a detailed process flow of learning objective image acquisition process in the learning sequence according to the first embodiment.

The acquisition of the learning objective image in S401 is a process of acquiring a plurality of images of the sample wafer 108 under the imaging conditions for ADR and under the imaging conditions for EDS. The flow of this process will be described with reference to FIG. 5.

First, the overall control unit 200 sets a region for acquiring a learning objective image from the sample wafer 108 (S501). This may be extracted by sampling a given observation target region, or may be set randomly within the sample plane. Next, the imaging condition control unit 204 sets the imaging conditions for ADR based on the data stored in the imaging condition storage unit 206 (S502). Next, the stage 109 is controlled by the stage control unit 201 such that the set acquisition region of the learning objective image is included in the imaging visual field of view of the SEM 101, and stage movement is performed (S503).

Next, the electron beam scanning control unit 202 controls the SEM 101 to scan the acquisition region of the learning objective image with the electron beam 115 and detect the secondary electron 117 and the backscattered electron 118 generated from the acquisition region of the learning objective image with the detector 111. The output signal from the detector 111 that detected the secondary electron 117 and the backscattered electron 118 is processed by the image processing unit 213 to perform the acquisition of the image for ADR (S504). The stage movement (S503) and the acquisition of the images for ADR (S504) are repeatedly performed, and after the images of the region set in S501 are acquired, the images are stored in the image storage unit 205.

When the acquisition of the images of the set region is completed, the imaging condition control unit 204 switches to the imaging condition for EDS based on the data stored in the imaging condition storage unit 206 (S505). Next, the stage 109 is controlled by the stage control unit 201 such that the set acquisition region of the learning objective image is included in the imaging visual field of view of the SEM 101, and stage movement is performed (S506).

Next, the electron beam scanning control unit 202 controls the SEM 101 to scan the acquisition region of the learning objective image with the electron beam and detect the secondary electron 117 and the backscattered electron 118 generated from the acquisition region of the learning objective image with the detector 111. The output signal from the detector 111 that detects the secondary electron 117 and the backscattered electron 118 is processed by the image processing unit 213, and the SEM 101 captures the acquisition region of the learning objective image to perform the acquisition of the image for EDS (S507). The stage movement (S506) and the acquisition of the images for EDS (S507) are repeatedly performed, and after the images of the region set in S501 are acquired, the images are stored in the image storage unit 205.

Note that the acquisition regions of the images for ADR and the images for EDS may be the same as each other or different from each other. Further, the order of acquiring the images for ADR and acquiring the images for EDS is not strictly limited, and the images may be acquired alternately.

Next, learning of estimation process parameters is performed (S402).

The detailed process flow of the estimation process parameter learning in S402 will be described with reference to FIG. 6.

First, the image processing unit 213 performs image preprocessing such as noise removal on all the images obtained by imaging in S401 (S601).

Next, the conversion process parameter updating unit 211 initializes a parameter for estimation process and a parameter for error calculation process (S602). At this time, the parameter for estimation process and the parameter for error calculation process learned in advance may be read from the conversion process parameter storage unit 207 and used as initial values.

Next, the image quality conversion process unit 209 converts the image acquired under the imaging conditions for EDS to the image quality of the image acquired under the imaging conditions for ADR based on the conversion process parameters updated by the conversion process parameter updating unit 211(S603), the conversion error calculation unit 210 calculates a conversion error (S604), and the conversion process parameter updating unit 211 updates the conversion process parameters such that the conversion error calculated in S604 is reduced (S605). Learning is performed by repeating the processes S603 to S605 described above. Finally, the obtained parameters are stored in the conversion process parameter storage unit 207 together with supplementary information such as imaging conditions (S606).

Figure 7:
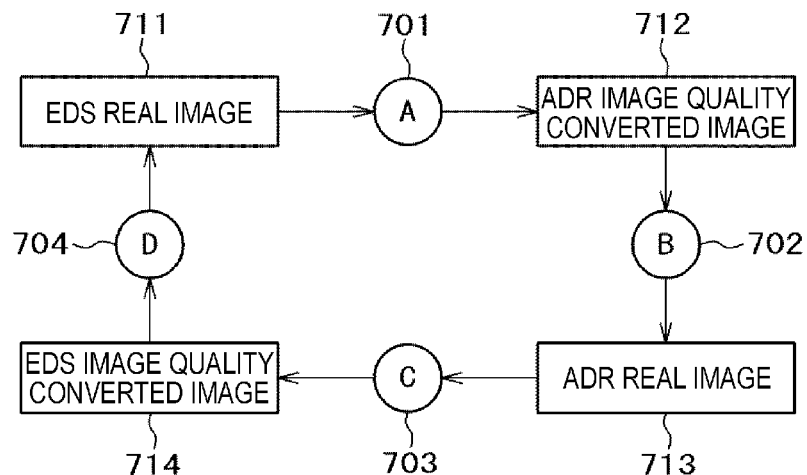
FIG. 7 is a block diagram showing a configuration of a neural network of the defect observation device according to the first embodiment.

As a method of converting the image quality of the image for EDS to the image quality of the image for ADR, a neural network described in Jun-Yan Zhu, et al. "Unpaired Image-to-Image Translation using Cycle-Consistent Adversarial Networks" arXiv preprint arXiv: 1703.10593 (2017) (Non-Patent Document 1) may be used. More specifically, as shown in FIG. 7, a neural network A 701 for converting an image quality from an EDS real image 711 to an ADR image quality converted image 712, a neural network B 702 for identifying the ADR image quality converted image 712 converted from the EDS real image 711 by the neural network A 701, and an ADR real image 713, a neural network C 703 for converting an image quality from the ADR real image 713 to an EDS image quality converted image 714, and a neural network D 704 for identifying the EDS image quality converted image 714 converted from the ADR real image 713 by the neural network C 703, and the EDS real image 711, may be used.

In the conversion error calculation (S604), the conversion error calculation unit 210 calculates an error in each neural network. The error of the neural network A 701 is determined by using the output value when the ADR image quality converted image 712 converted from the EDS real image 711 by the neural network A 701 is input to the neural network B 702, and a difference between the EDS image quality converted image 714 obtained by converting, by the neural network C 703, the ADR image quality converted image 712 converted from the EDS real image 711 by the neural network A 701 and the EDS real image 711 as the original image.

In the calculation of the error, the difference between the EDS image quality converted image 714 obtained by converting, by the neural network C 703, the ADR image quality converted image 712 image converted from the EDS real image 711 by the neural network A 701 and the EDS real image 711 as the original image, is used so that it is possible to learn to convert the image quality while retaining information sufficient to reconstruct the original image.

In the neural network B 702, one of the ADR image quality converted image 712 obtained by converting the EDS real image 711 by the neural network A 701 and the ADR real image 713 is input, and learning may be performed with (1—output value) as an error when the ADR image quality converted image 712 is input and (output value) as an error when the ADR real image 713 is input, so that 1 may be output when the ADR image quality converted image 712 is input and 0 is output when the ADR real image 713 is input.

The error of the neural network C 703 is determined using an output value when the EDS image quality converted image 714 converted from the ADR real image 713 by the neural network C 703 is input to the neural network D 704, and a difference between the ADR image quality converted image 712 obtained by converting, by the neural network A 701, the EDS image quality converted image 714 converted from the ADR real image 713 by the neural network C 703 and the ADR real image 713 as an original image.

In the neural network D 704, one of the EDS image quality converted image 714 obtained by converting the ADR real image 713 by the neural network C 703 and the EDS real image 711 is input, and learning may be performed with (1—output value) as an error when the EDS image quality converted image 714 is input, and (output value) as an error when the EDS real image 711 is input, so that 1 may be output when the EDS image quality converted image 714 is input and 0 may be output when the EDS real image 711 is input.

Further, an error in learning the neural networks B 702 and D 704 may be any other value as long as learning can be performed so that the output value is larger when the converted image is input and the output value is smaller when the real image is input.

In updating the conversion process parameters (S605), a general error back propagation method may be used in learning the neural network. In addition, when the estimation error is calculated, all of the acquired learning objective image pairs (combination of the images for ADR and the images for EDS) may be used, or a mini-batch method may be used. That is, the parameters may be repeatedly updated by randomly extracting several images from the learning objective image pairs. The order and frequency of learning the neural networks A 701 to D 704 are not strictly limited. For example, the neural networks A 701 and C 703 may learn twice as many times as the neural networks B 702 and D 704 learn.

When an image for ADR and an image for EDS having the same imaging range are used, only the neural network A 701 may be learned, or only the neural networks A 701 and B 702 may be learned. As a method for learning only the neural network A 701, a method described in JP-A-2018-137275 may be used.

Further, as one method of learning the neural networks A 701 and B 702, a neural network described in Phillip Isola, et al. "Image-to-Image Translation with Conditional Adversarial Networks" arXiv preprint arXiv: 1611.07004 (2016) (Non-Patent Document 2) may be used. Specifically, for the conversion error of the neural network A 701, the difference between the image converted from the image for EDS by the neural network A 701 and the paired image for ADR, and the output value when the converted image is input to the neural network B 702, may be used.

Learning is performed by repeating the processes of S603 to S605 described above a preset designated number of times. However, the repeated process may be terminated in the middle depending on the conversion error obtained. The finally obtained estimation process parameter is stored and held in the conversion process parameter storage unit 207 together with supplementary information such as the name of the process, or the like (S606).

In the image quality conversion process in S313, the neural network A 701 may be used. However, while the present embodiment is described based on the assumption that the image for EDS is converted to the image quality of the image for ADR, when matching the image quality of the image for ADR and the image for EDS, three methods, that is, the method of converting the image for ADR to the image quality of the image for EDS, the method of converting the image for EDS into the image quality of the image for ADR, and the method of converting the image for ADR and the image for EDS to a third image quality, can be considered.

When the SEM that can observe a sample having various structures under various imaging conditions is used, it is anticipated that the conversion method suitable for calculating a positional shift amount is varied. Therefore, a conversion method effective for calculating the positional shift amount may be determined for each input image, or two or more conversion methods may be implemented to have comprehensive determination, or a conversion method designated by a GUI and the like may be performed.

Note that the image of the third image quality is not limited to the image under the third imaging condition, and may be other than the image acquired by the present defect observation device, such as a simulation image and the like. In addition, the conversion to the third image quality may be performed by applying image processing such as edge extraction, shading correction, noise removal, and contrast adjustment to adjust the image quality without performing acquisition of an image of the third image quality or machine learning. Note that when the conversion method is effective for calculating the positional shift amount, it means that a shape of a pattern or a defect site in an image effective for position alignment between images is clear in the converted image.

Figures 8, 9:
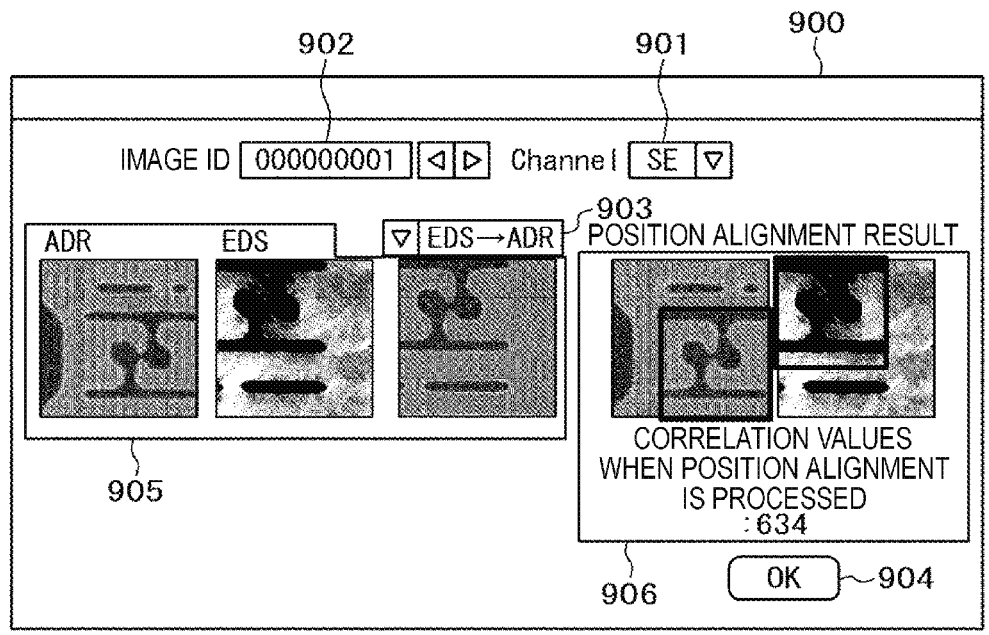
FIG. 8 is a front view of a screen showing an example of a GUI of the defect observation device according to the first embodiment.
FIG. 9 is a front view of a screen showing an example of a conversion confirmation screen of the defect observation device according to the first embodiment.

Next, a GUI according to the present embodiment will be described. First, in the learning objective image acquisition process S500, a GUI 800 for setting acquisition conditions of an image for ADR, an image for EDS, and an image of the third image quality is provided (FIG. 8).

Further, a GUI for setting to use an image prepared in advance, such as an image of another sample or a simulation image for the image of the third image quality may be provided. For each item set in the "IMAGING CONDITION" 801 column, the imaging conditions of "ADR" 802, the imaging conditions of "EDS" 803, the imaging conditions of "THIRD" image 804, and the "CONVERSION OF IMAGES TO BE USED" 810 are set through the GUI 800, and then the "LEARNING START" button 805 is pressed, and the learning sequence of S305 can be performed.

The items to be set in the "IMAGING CONDITION" 801 column include a probe current which is a current of the electron beam 115 irradiating the sample wafer 108 by the SEM 101 set in S502 or S505, an acceleration voltage for accelerating electrons, the number of added frames, and the like.

In addition, when the "CANCEL" button 806 is pressed during execution of the learning sequence, the learning sequence can be interrupted. Further, the GUI 800 displays an input unit 807 that sets the number of learning objective images to be acquired, and an input unit 808 that sets the maximum repetition number.

Further, when performing image processing for conversion to the third image quality, a GUI for setting image process parameters with GUI 800 is provided, and there is no need to learn conversion to the third image quality.

Pressing the "CONVERSION CONFIRMATION" button 809 leads to switching to a screen GUI 900 as shown in FIG. 9. This screen 900 displays a channel selection unit 901, an image ID selection button 902, a conversion process selection button 903, an "EXECUTE" button (OK button) 904, an image display area 905, and a position alignment result display area 906.

The channel selection unit 901 designates a type of an image such as a secondary electron image (SE) or a back-scattered electron image (BSE). An image ID selection button 902 designates the number of the image stored in the image storage unit 205.

The conversion process selection button 903 selects an image to be converted from among the image acquired under the imaging conditions for ADR and the image acquired under the imaging conditions for EDS displayed in the image display area 905.

That is, one of a conversion of the image acquired under the imaging conditions for ADR to the image quality of the image acquired under the imaging conditions for EDS, a conversion of the image acquired under the imaging conditions for EDS to the image quality of the image acquired under the imaging conditions for ADR, and a conversion of the image acquired under the imaging conditions for EDS and the image acquired under the imaging conditions for ADR to a third image quality, is selected.

The example shown in FIG. 9 shows a state when the conversion of an image acquired under the imaging conditions for EDS to the image quality of an image acquired under the imaging conditions for ADR is selected.

When the "EXECUTE" button 904 is pressed, the conversion process and the position alignment process for the image ID designated using the conversion parameter are executed. In the image display area 905, an image acquired under the imaging conditions for ADR, an image acquired under the imaging conditions for EDS, and an image of which image quality is converted by the conversion method selected by the conversion process selection button 903 (in the example shown in FIG. 9, the image obtained by converting the image acquired under the imaging conditions for EDS is converted to the image quality of the image acquired under the imaging conditions for ADR.) are displayed.

In the position alignment result display area 906, the position alignment process result is displayed. A correlation value and the like used during position alignment may be displayed together with the position alignment result.

Although the present embodiment is described based on the assumption that EDS is performed after ADR is executed, it is possible that, after executing the ADR, the imaging condition may be changed and the ADR may be performed again, or another defect observation flow requiring a defect position may be performed.

As described above, according to this embodiment, the learning objective images are acquired in advance under the imaging conditions in ADR and the imaging condition in EDS, respectively, and in the acquired learning objective images, the conversion process parameter for converting the image quality of the image acquired under the imaging conditions of EDS, for example, is adjusted such that the corresponding position matches the image quality of the image acquired under the imaging conditions of ADR (conversely, the conversion process parameters for converting the image quality of the image acquired under the imaging conditions of ADR is adjusted such that the corresponding position matches the image quality of the image acquired under the imaging conditions of EDS), so that it is possible to save the trouble of adjusting the conversion process parameters for each defect observation at the time of defect observation.

According to the present embodiment, it is possible to calculate the positional shift amount between the image captured under the first imaging condition (for example, ADR) and the image captured under the second imaging condition (for example, EDS), so that the defect coordinates in the image under the second imaging condition can be calculated using the defect coordinates in the image under the first imaging condition, and thus the defect analysis can be performed under the second imaging condition without adjusting the defect detection parameter, thereby improving the defect observation throughput including defect analysis and reducing the load on the user.

Second Embodiment

In the first embodiment, in step S603 of the image quality conversion process method shown in FIG. 6, the method using the neural network shown in FIG. 7 is described as a method of converting the image quality from the EDS real image to the ADR image quality converted image, but the present embodiment will be described with reference to a method that uses the convolutional neural network. Except for the method of converting the image quality from the EDS real image to the image for an ADR image quality converted image, the method of the present embodiment is the same as that described in the first embodiment and this will not be described below.

Figure 6:
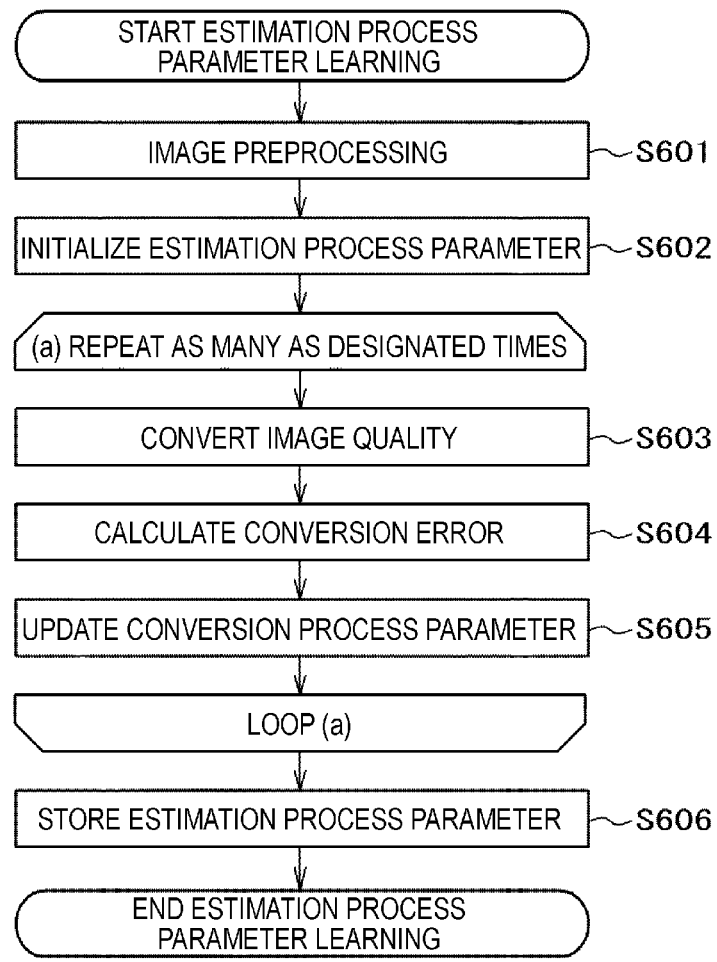
FIG. 6 is a flowchart showing a detailed process flow of estimation process parameter learning process in the learning sequence according to the first embodiment.
Figure 10:
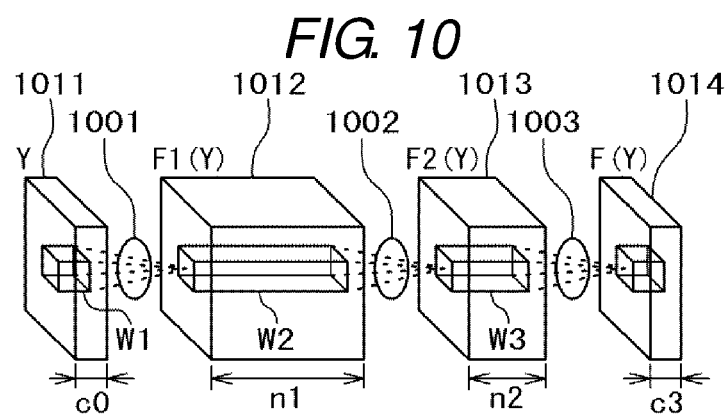
FIG. 10 is a block diagram showing a configuration of a neural network of the defect observation device according to a second embodiment.

As an image quality conversion method in place of the method of converting the image quality from the EDS real image to the ADR image quality converted image in step S603 of the image quality conversion process in FIG. 6 of the first embodiment, the present embodiment uses convolutional neural networks 1001 to 1003 as shown in FIG. 10. Here, Y 1011 represents an EDS real image, F1(Y) 1012 and F2(Y) 1013 represent intermediate data, and F(Y) 1014 represents an estimation result of the ADR image quality converted image.

The intermediate data and the final result are calculated by the following equations such as (Equation 1) to (Equation 3). In (Equation 1) to (Equation 3), "*" represents a convolution operation. Here, W1 represents the n1-number of filters having a size of c0×f1×f1, c0 represents the number of channels of the input image, and f1 represents a size of the spatial filter. An n1-dimensional feature map is obtained by convolving the filter having the size of c0×f1×f1 for the input image as many as n1 times.

B1 represents an n1-dimensional vector, which is a bias component corresponding to the n1-number of filters. Similarly, W2 represents a filter having a size of n1×f2×f2, B2 represents an n2-dimensional vector, W3 represents a filter having a size of n2×f3×f3, and B3 represents a c3-dimensional vector.

$$F1(Y) = \max(0, W1*Y+B1) \quad \text{(Equation 1)}$$

$$F2(Y) = \max(0, W2*F1(Y)+B2) \quad \text{(Equation 2)}$$

$$F(Y) = W3*F2(Y)+B3 \quad \text{(Equation 3)}$$

Among these, c0 and c3 are values determined by the number of channels of the EDS real image and the image for an ADR image quality converted image. In addition, f1 and f2, and n1 and n2 are hyperparameters determined by a user before the learning sequence is performed, and these may be f1=9, f2=5, n1=128, and n2=64, for example. The parameters to be adjusted in the process corresponding to the learning process of the estimation process parameter (S402) in FIG. 4 described in the first embodiment are W1, W2, W3, B1, B2, and B3.

Note that another configuration may be used as the configuration of the convolutional neural network described above. For example, the number of layers may be changed, or a network having four or more layers may be used.

In the process corresponding to the estimation process parameter updating process (S605) of FIG. 6 described in the first embodiment, a general error back propagation method may be used in learning the neural network.

When calculating the estimation error, all of the acquired learning objective image pairs may be used, or a mini-batch method may be used. That is, the parameters may be repeatedly updated by randomly extracting several images from the learning objective image pairs.

Furthermore, a patch image may be randomly cut out from one image pair and may be used as an input image Y of the neural network. In this manner, the learning can be performed efficiently.

The processing corresponding to the conversion error calculation process (S604) in FIG. 6 described in the first embodiment is a process for evaluating the difference (error) between the estimation result F (Y) and the high quality image, and the parameter is updated such that the estimation error obtained in this process is small. As a method of quantifying a difference (error) between images, a mean square error and the like may be used.

According to the present embodiment, it is possible to estimate a high quality image from a degraded image captured under a high-throughput imaging condition by providing the processing function described above to the defect observation device, so that it is not necessary to take a relatively lengthy time to image the sample wafer 108 using the SEM 101 under a condition for acquiring a high quality image to acquire a high quality image, thereby achieving both high throughput and high image quality.

That is, the defect observation device described in the first and second embodiments includes a controller including a table on which a sample is placed, a charged particle beam source that scans and irradiates the sample placed on the table with a charged particle beam, a charged particle microscope having a detector that detects a secondary charged particle generated from the sample which is scanned and irradiated with the charged particle beam by the charged particle beam source, a control unit that controls the charged particle microscope, a storage unit that stores information including information for controlling the charged particle microscope in the control unit, an arithmetic unit that processes the image of the sample acquired by the charged particle microscope, and an analysis unit that analyzes the sample based on a detection signal of the secondary charged particle generated from the sample detected by the charged particle microscope, in which the control unit controls the charged particle microscope under a first condition to acquire a first image of an observation target region of the sample, the arithmetic unit extracts first position information of the observation target region from the obtained first image, the control unit controls the charged particle microscope under a second condition to acquire a second image of the observation target region of the sample, and the arithmetic unit performs an image quality conversion process to match the image quality of the acquired second image with the image quality of the first image using the image quality conversion process parameters stored in the storage unit to process the second image subjected to the image quality conversion process.

Then, the control unit processes the second image subjected to the image quality conversion process using the first position information of the observation target region extracted from the first image to extract the observation target region from the second image subjected to the image quality conversion process.

Further, the control unit controls the charged particle microscope under a third condition based on the first position information of the observation target region extracted by the arithmetic unit to acquire a third image, having a higher magnification than the first image, of the observation target region of the sample, and the analysis unit analyzes the composition of the observation target region based on the information of the observation target region extracted from the second image subjected to the image quality conversion process.

Further, the defect observation method using the charged particle microscope apparatus described in the first and second embodiments includes, by the control unit of the charged particle microscope apparatus, controlling the charged particle microscope under a first condition to acquire a first image of the observation target region of the sample, by the arithmetic unit of the charged particle microscope apparatus, extracting first position information of the observation target region from the obtained first image, by the control unit, controlling the charged particle microscope under a second condition to acquire a second image of the observation target region of the sample, and by the arithmetic unit, performing an image quality conversion process to match the image quality of the acquired second image with the image quality of the first image using the image quality conversion process parameters stored in the storage unit to process the second image subjected to the image quality conversion process.

As described above, although the invention made by the inventors has been specifically described based on the embodiments, it is needless to say that the present invention is not limited to the embodiments described above, and can be variously modified without departing from the gist thereof. For example, the embodiments described above are described in detail in order to explain the present invention in an easy-to-understand manner, and are not necessarily limited to those having all the configurations described above. In addition, it is possible to add, delete, and replace other configurations for a part of the configuration of each embodiment.

What is claimed is:

1. A defect observation device comprising a charged particle microscope and a controller,
   wherein the charged particle microscope includes an energy source that is irradiated with an observation energy to irradiate the sample, a table on which a sample is placed, and a detector, and
   the controller is configured to:
   (A) acquire a first image which is a first type of image in which a predetermined portion of the sample is imaged using a first imaging condition, and acquire a first coordinate that indicates a region where the predetermined portion in the first image is imaged;
   (B) acquire a second image which is a second type of image in which the predetermined portion is imaged using a second imaging condition;

(C) input the first image or the second image to an image quality conversion program to acquire one or more images of the predetermined portion;
(D) estimate, based on the image of the predetermined portion, a difference between the first coordinate and a second coordinate that indicates a region where the predetermined portion in the second image is imaged; and
(E) acquire the second coordinate based on the difference estimated in (D) and the first coordinate, and wherein the acquiring the one or more images of the predetermined portion in (C) includes one or more acquisition processes of:
(1) a first acquisition process of converting the first image from the first type to the second type by the image quality conversion program to acquire one or more predetermined images;
(2) a second acquisition process of converting the second image from the second type to the first type by the image quality conversion program to acquire one or more predetermined images; and
(3) a third acquisition process of converting the first image and the second image to a third type different from the first and second types by the image quality conversion program to acquire one or more predetermined images.

2. The defect observation device according to claim 1, wherein the controller is capable of processing at least two or more of the first acquisition process to the third acquisition process, and
the controller is configured to:
(F) receive an operation instruction to select one or more acquisition processes from at least two or more of the first acquisition process to the third acquisition process.

3. The defect observation device according to claim 1, wherein the controller is capable of processing at least two or more of the first acquisition process to the third acquisition process, and
the controller is configured to:
(G) select one or more acquisition processes from at least two or more of the first acquisition process to the third acquisition process based on a predetermined reference.

4. The defect observation device according to claim 2, wherein one or more of an acceleration voltage of the energy source and a probe current of the first imaging condition and the second imaging condition are different.

5. The defect observation device according to claim 4, wherein the first acquisition process and the second acquisition process are performed using a parameter obtained by machine learning based on the first type of image and the second type of image acquired in advance.

6. The defect observation device according to claim 5, wherein the third acquisition process is performed using a parameter obtained by machine learning using the third type of image.

7. The defect observation device according to claim 6, wherein the third type of image is one of an image acquired by the third acquisition process, or a simulation image, or an image acquired by another device.

8. The defect observation device according to claim 5, wherein the third acquisition process clarifies effective information for position alignment by image processing with respect to the first type of image and the second type of image.

9. A defect observation device comprising a charged particle microscope and a controller,
wherein the charged particle microscope includes an energy source that is irradiated with an observation energy to irradiate the sample, a table on which a sample is placed, and a detector, and
the controller is configured to:
(A) acquire a first image in which a predetermined portion of the sample is imaged using a first imaging condition and acquire a first coordinate that indicates a region where the predetermined portion in the first image is imaged;
(B) acquire a second image in which the predetermined portion is imaged using a second imaging condition;
(C) input the first image or the second image to a machine learning program to acquire one or more images of the predetermined portion;
(D) estimate, based on the image of the predetermined portion, a difference between the first coordinate and a second coordinate that indicates a region where the predetermined portion in the second image is imaged; and
(E) acquire the second coordinate based on the difference estimated in (D) and the first coordinate, and wherein the machine learning program is learned using:
(C1) a first sample image captured using the first imaging condition with respect to another sample specimen different from the sample; and
(C2) a second sample image captured using the second imaging condition with respect to the sample specimen.

10. The defect observation device according to claim 9, wherein the energy source is a charged particle optical system that irradiates the sample placed on the table with a converged charged particle beam, the detector detects a secondary charged particle generated from the sample irradiated with the converged charged particle beam by the charged particle optical system, and the controller controls the charged particle optical system to acquire the first image using the first imaging condition, and acquire the second image using the second imaging condition different from the first imaging condition.

11. The defect observation device according to claim 10, wherein the controller extracts a region of interest from the acquired first image, and the controller further controls the charged particle optical system to acquire a detailed image of the region of interest extracted from the first image.

12. The defect observation device according to claim 10, wherein the controller controls the charged particle optical system, and changes at least one of an acceleration voltage and a probe current of the charged particle beam irradiating the sample under the first imaging condition and the second imaging condition.

13. The defect observation device according to claim 10, wherein the controller is configured to perform, using the machine learning program, an image quality conversion process to match the image quality of the acquired second image with the image quality of the acquired first image to calculate a positional shift amount with respect to the region of interest in the position corresponding to the region of interest extracted from the first image in the image subjected to the image quality conversion process, and extract a region of interest corresponding to the region of interest extracted from the first image in the image subjected to the image quality conversion process based on the calculated positional shift amount.

14. The defect observation device according to claim 13, wherein the controller is configured to control the charged particle optical system to irradiate the region of interest extracted from the image subjected to the image quality conversion process with the charged particle beam, and receive a signal obtained by detecting the secondary charged particle generated from the region of interest irradiated with the charged particle beam with the detector to analyze a composition of the region of interest irradiated with the charged particle beam.

15. The defect observation device according to claim 9,
wherein the first imaging condition controlled by the controller is an imaging condition for performing a defect image automatic collection processing, and
the second imaging condition controlled by the controller is an imaging condition for analyzing the composition of the predetermined portion and automatically performing a classification process on the second image.

\* \* \* \* \*